United States Patent [19]

Danzeisen

[11] Patent Number: 4,758,783
[45] Date of Patent: Jul. 19, 1988

[54] COMPENSATION NETWORK FOR COMPENSATING THE FREQUENCY RESPONSE OF A SPECTRUM ANALYZER

[75] Inventor: Klaus Danzeisen, Graefelfing, Fed. Rep. of Germany

[73] Assignee: Rohde & Schwarz GmbH & Co. KG, Fed. Rep. of Germany

[21] Appl. No.: 101,442

[22] Filed: Sep. 28, 1987

[30] Foreign Application Priority Data

Oct. 10, 1986 [DE]  Fed. Rep. of Germany ....... 3634528

[51] Int. Cl.[4] ........................................... G01R 33/20
[52] U.S. Cl. ............................... 324/77 B; 324/79 D
[58] Field of Search ............... 324/77 R, 77 B, 77 C, 324/77 CS, 79 R, 79 D, 78 D; 364/485, 486, 487

[56] References Cited

U.S. PATENT DOCUMENTS

| | | | |
|---|---|---|---|
| 3,955,137 | 5/1976 | Harrington | 324/79 R |
| 4,238,727 | 12/1980 | Madni | 324/77 CS |
| 4,568,878 | 2/1986 | Bales | 364/485 |
| 4,578,638 | 3/1986 | Takano | 324/79 R |
| 4,607,215 | 8/1986 | Takano | 324/77 B |
| 4,613,814 | 9/1986 | Penney | 324/77 B |
| 4,652,816 | 3/1987 | Crookshanks | 324/77 B |
| 4,703,433 | 10/1987 | Sharrit | 364/485 |
| 4,719,413 | 1/1988 | Basile | 324/77 B |

Primary Examiner—Michael J. Tokar
Attorney, Agent, or Firm—Hill, Van Santen, Steadman & Simpson

[57] ABSTRACT

For a fast and accurate frequency response compensation of a spectrum analyzer, the frequency-dependent control values for controlled amplifier are stored as digital values in a digital memory, and in between the memory and a sweep generator of a heterodyne oscillator, an analog-to-digital converter is disposed to provide frequency-proportional digital values of which the associated frequency-dependent control values stored in a memory can be selected and supplied to the controlled amplifier.

7 Claims, 1 Drawing Sheet

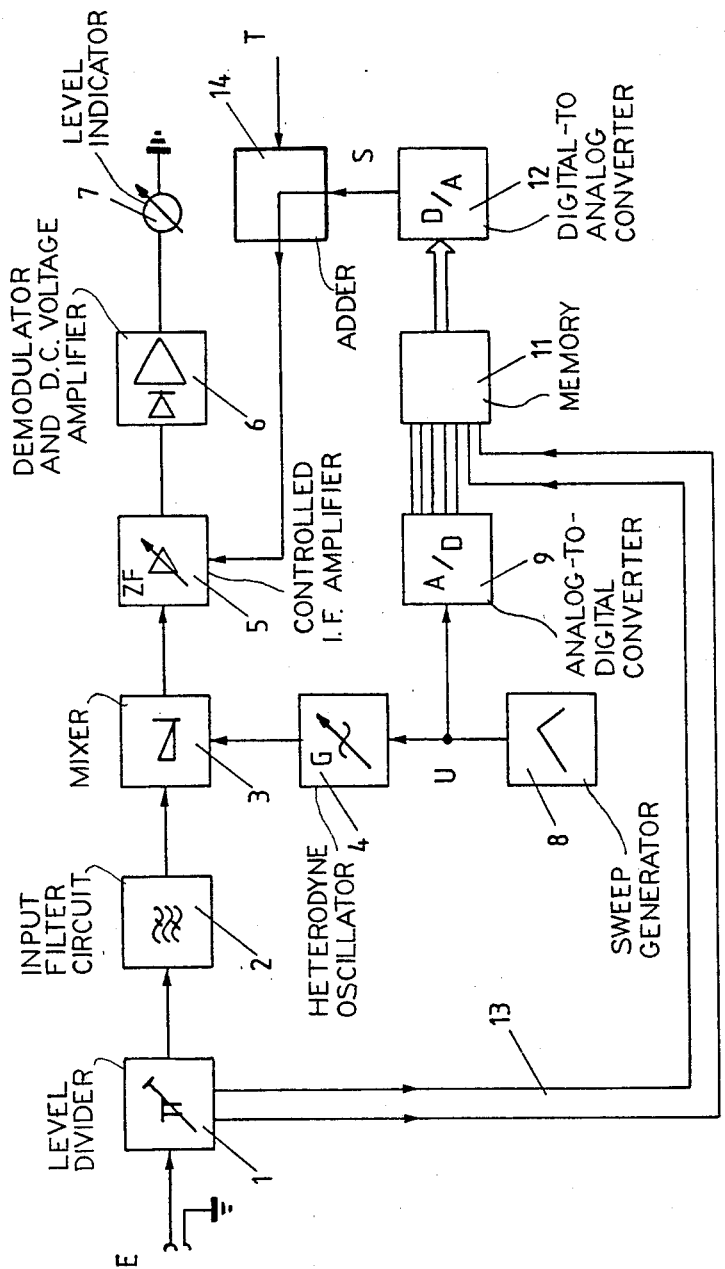

COMPENSATION NETWORK FOR COMPENSATING THE FREQUENCY RESPONSE OF A SPECTRUM ANALYZER

BACKGROUND OF THE INVENTION

1. Field of the Invention

The present invention is concerned with a network for compensating the frequency response of a spectrum analyzer, in which the heterodyne oscillator off the network, which cooperates with a mixer in the frequency synthesizer circuit, is controlled by way of a sweep voltage of a sweep generator, the network comprising a controllable level varying circuit disposed in the frequency synthesizer circuit for controlling the output level in response to the sweep voltage in a frequency-compensating sense.

2. Description of the Prior Art

For frequency-selective measurement off the level of a high frequency (Hf) voltage, spectrum analyzers are employed which operate on the heterodyne principle with a hyterodyne sweep-frequency oscillator and convert the Hf input signal to be measured either to an intermediate frequency or directly to a D.C. voltage signal. The frequency synthesizer off such a spectrum analyzer includes various mixers with filters, frequently also level dividers and other components, which cause an undesirable frequency response, i.e. an undesirable variation of the level in response to the respective frequency. In addition to such an undesirable frequency response, the spectrum analyzers also, in most cases, have an undesirable temperature dependents.

In order to eliminate such an undesirable frequency response and in order to achieve an accurate level measurement, it has been known in the art (Spectrum Analyzer hp 8568A of Hewlet Packard) to derive a frequency-proportional analog control value through an additional resistor-diode network to which the sweep voltage is supplied, the control value being used to change the level in the spectrum analyzer in a frequency response compensating sense. To this end, the frequency synthesizer of the spectrum analyzer has a respective controlled amplifier or controlled attenuator provided, preferably in the intermediate frequency (If) circuit or in the D.C. voltage circuit after a demogilator. Such a known compensating analog network can only eliminate the average frequency response at a reasonable circuit design effort, but is unable to eliminate it completely.

In processor-controlled measurement receivers in which the heterodyne frequency can be adjusted by way of a synthesizer through the processor system, it is known per se for compensating the frequency response to provide an additional digital memory for storing the corresponding level-correcting values for the various heterodyne frequencies in the form of digital values, and for the compensation of frequency response, this stored digital value is then directly used in the processor system for correcting the measured value. Although this compensation method is as accurate as desired, it has the drawback that it cannot be used at a rapidly-varying frequency such as in the case of a spectrum analyzer.

"It is known with respect to spectrum analyzers to provide, in the frequency synthesizer circuit behind the mixer, a variable gained amplifier" (Zirwick, Eine Neuentwicklungauf dem Gebiet der Spektrum Analysatoren, Frequenz, Vol. 8, No. 3, 1974, pp 66–72) by way of which the output level is manually adjustable by the user. Furthermore, it is known in a microprocessor-controlled sweep generator to provide a controllable amplifier in the frequency synthesizer circuit for adjusting the modulation amplitude, the amplifier being likewise controllable through the microprocessor (Hewlett Packard Journal, September 1982, pp. 30–36.)

SUMMARY OF THE INVENTION

It is therefore the object of the present invention to provide a frequency response compensating network which permits accurate compensation of the frequency response, also in the case of a spectrum analyzer having a rapidly varying heterodyne frequency, while the network is of simple circuit design.

The above object is achieved in the network of a type set forth above which is particularly characterized in that the frequency-dependent control values for the level varying circuit are stored as digital values in a digital memory and that between the digital memory and the sweep generator an analog-to-digital converter is disposed through the digital values which are proportional to the sweep voltage, the associated frequency-dependent control values stored in the digital memory being selected and applied to the level varying circuit.

The network is further characterized in that the controllable level varying circuit includes a controllable amplifier and that between the digital memory and the control input to the level varying circuit a digital-to-analog converter is provided for converting the digital values stored in the digital memory to corresponding analog control values.

The network is further characterized in that the maximum number of control values resulting from the resolution of the analog-to-digital converter are stored as digital values in the digital memory.

The network is further particularly characterized, for a spectrum analyzer including an input level divider capable of being switched in plural stages, in that the frequency-dependent digital values for the level varying circuit are stored separately for each switching stage of the input level divider, and the input level divider is connected to the digital memory in such a manner by way of control lines that in each switching stage of the input level divider the frequency-dependent control values respectfully associated therewith are selected and applied to the level varying circuit.

Another feature of the invention is particularly characterized in that between the digital-to-analog converter and the control input of the level varying circuit an adder circuit is disposed for superposing an additional temperature-dependent control value on the frequency-dependent control value.

The compensating network constructed in accordance with the present invention permits the frequency-proportional control values, which are determined for example during manufacture of the device and are stored in the digital memory, to be quickly scanned by way of a simple switching operation via the analog-to-digital converter between the sweep generator and the memory, and the control values will then directly adjust the level changing circuit correspondingly. Therefore, any frequency-dependent level variation is immediately corrected correspondingly, even at a very fast frequency variation, and the network constructed in accordance with the invention therefore also permits frequency response compensation of desired accuracy even in the case of a spectrum analyzer exhibiting extremely fast variations of the heterodyne frequency. The accuracy is determined exclusively by the resolution of the analog-to-digital converter and can therefore be made as precise as desired. When a level varying circuit is used which can be directly controlled digitally, for instance when a digitally-controlled amplifier or a digitally-controlled attenuator circuit is used, it is possible by way of the digital control values read from the digital memory to directly vary and correct the level in the frequency synthesizer circuit of the analyzer accordingly. For practical reasons, however, analog-controlled amplifiers or attenuators are used whose amplification or attenuation factor can be correspondingly controlled by way of a control voltage or control current. In this case, it will only be required to provide a digital-to-analog converter at the output of the digital memory for converting the digital control value read from the memory to a corresponding analog control value, for example a control voltage, by way of which the controllable level varying circuit is indirectly actuated.

The number of correcting values which can be stored in the digital memory and which is determined once by a measurement operation, for example upon manufacture of the device, and is then stored in memory, and is then stored in memory, depends on the desired accuracy of the frequency response compensation. When a frequency response occurs only within a certain frequency range, it is not absolutely necessary to store in the memory the maximum number of digital control values actualy resulting from the resolution of the analog-to-digital converter employed. The resolution of the analog-to-digital converter to which the sweep voltage is applied results from the number of bits of the converter; this means that an 8-converter is able to scan in $2^8 = 256$ in the sweep voltage at the input, for example a linearly-increasing saw-tooth voltage. In that case the digital memory has a maximum of 256 memory locations in which 256 associated digital control values can be stored which, however, need not be fully utilized in each case, as has been set forth above.

In an analyzer having a switchable level divider at the input side, which results in a different overall frequency response in the individual switching positions, it may furthermore be advantageous also to consider these frequency-dependent data of the switchable level divider for the compensation of frequency response by storing in the digital memory the frequency-dependent correcting values for the various switching stages of the level divider as discrete sets which can be fetched correspondingly in dependents on the switching position of the input divider. Finally, it has proven advantageous to provide, in addition to the compensation of the frequency response, also a compensation of the temperature dependents; to this end, when an analog control value for the level varying circuit is processed, a corresponding temperature-dependent analog control value is directly superposed on the level varying circuit, the analog control value being generated either purely on an analog basis via a corresponding temperature sensor or being determined by calculation through a processor system naturally provided in the device and converted in a corresponding digital-to-analog converter to a suitable additional analog control value. If appropriate, it is also possible that such a temperature correction value obtained through a processor system is taken into account direclty in the digital memory and that the frequency-proportional digital control value stored therein are varied in response to the temperature. For analog compensation of the temperature dependents, it is advantageous to use a level varying circuit which exhibits a linear relationship between the analog control value and the level variation, because in that case no additional correction steps will be necessary. The level varying circuit can be disposed anywhere along the level processing portion in the analyzer, for example also in the frequency-dependent input circuit preceeding the mixer. However, it is preferred to have the level varying circuit disposed in the frequency-independent processing portion succeeding the mixer, i.e. in the IF circuit or in the low frequency (LF) circuit succeeding the demodulator.

BRIEF DESCRIPTION OF THE DRAWING

Other objects, features and advantages of the invention, its organization, construction and operation will be best understood from the following detailed description, taken in conjunction with the accompanying drawing on which there is a single f which is a schematic representation of a spectrum analyzer constructed in accordance with the present invention.

DESCRIPTION OF THE PREFERRED EMBODIMENTS

Referring to the drawing, a basic circuit diagram of a spectrum analyzer is illustrated for frequency-selective measurement of the HF level of an input signal E, which is supplied by way of a level divider 1 that is, for example, digitally adjustable, and an HF input filter circuit 2 to a mixer 3 in which the frequency of the input signal E is converted with the heterodyne frequency of a heterodyne oscillator 4 to a fixed intermediate frequency which is, in turn, supplied through a controlled IF amplifier 5 to a demodulator and D.C. voltage amplifier 6. The level (amplitude) of the thus processed input signal is indicated, for example, by a level indicator 7. The heterodyne oscillator 4 is controlled by way of a sweep voltage U, for example a saw-tooth voltage, of a sweep generator 8 and is tuned in a predetermined frequency range. The sweep voltage U is supplied to an analog-to-digital converter 9 in which it is converted to a corresponding digital value which is proportional to the sweep frequency. The resolution of the analog-to-digital converter 9 determines the number of scanning points of the sweep voltage 8; an 8-bit-converter having eight output lines 10 permits 256 discrete scanning steps, based on the sweep frequency band of the heterodyne oscillator 4 determined by the saw-tooth voltage U. By way of the eight output lines 10, the analog-to-digital converter 9 is coupled to a digital memory 11 which has a maximum number of memory locations corresponding to the resolution of the analog-to-digital converter 9 (e.g. 256 memory locations). The discrete memory locations have stored therein, for example, the frequency response characteristics which, during the manufacturing process of the device, correspond to the individual frequencies of the heterodyne frequency; in the mentioned sample, these will amount to, for example a maximum of 256 discrete correction values. The discrete frequency-proportional correction values stored in the memory 11 can be read out by way of the control lines 10 of the analog-to-digital converter 9 and can be converted by a digital-to-analog converter 12 to a corresponding analog output signal S, for example a control voltage for the variable gain IF amplifier 5. Therefore, each individual D.C. value of the sweep voltage U has its associated frequency-proportional digital correction value rapidly read from the digital memory 11 via the analog-to-digital converter 9 to be supplied from the output of the digital memory to the digital-to-analog converter 12, which thereby immediately controls the amplifier 5 accordingly to thereby correct the input signal level accordingly.

Since the adjustable level divider 1 may also be frequency-dependent and results in a different overall frequency response as determined by the selected switching stage, it also appears advantageous to consider the level correction for the respective switching position of the level divider 1. To this end, the level divider 1 is connected to the digital memory 11 by way of respective control lines 13. For clarity's sake, the illustrated embodiment shows only two control lines for two switching stages. The digital memory contains, for each switching stage, i.e. for two switching stages in the present example, separate memory groups in which the frequency-proportional control values of the overall frequency response associated with each switching stage are stored. Thereby, the respective associated memory groups will always be selected via the control appliance 13 in accordance with the selected switching stage, and from the memory the associated frequency-proportional control values are then selected via the analog-to-digital converter 9. In this manner, it is possible to completely eliminate the frequency response of an analyzer between an input connection and a frequency-independent amplifier stage.

Through the provision of an adder 14, which is disposed in the control line between the digital-to-analog converter 12 and the control input on the IF amplifier 5, it is possible to superpose on the analog control voltage S an additional temperature dependence compensating component T which is supplied, for example, as an analog value T via a suitable temperature sensor or which is calculated in a microprocessor and after digital-to-analog conversion is supplied by way of the input T. When such an additional temperature compensation is employed, it is appropriate to make use of a controlled amplifier 5 which exhibits an linear relationship between its control voltage and the amplification gain.

The digital memory 11 may be an EPROM, and the storage capacity thereof is determined by the desired accuracy of correction.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A network for compensating the frequency response of a spectrum analyzer, comprising:
    a mixer including an input for receiving a high-frequency input signal, a heterodyne signal input, and an output;
    heterodyne means including a sweep voltage generator and a variable frequency heterodyne oscillator connected to and controlled by the sweep voltage of said sweep voltage generator and connected to said heterodyne input of said mixer;
    a level varying circuit including an input connected to said output of said mixer, a level control input, and an output for providing a compensated signal;
    an analog-to-digital converter including an input connected to said sweep voltage generator, and a plurality of outputs;
    a memory storing frequency-dependent digital control values which are proportional to the sweep voltage, said memory including a plurality of inputs connected to said outputs offset analog-to-digital converter and a plurality of outputs, said frequency-dependent digital control values read from said memory in response to said sweep voltage; and
    a digital-to-analog converter including a plurality of inputs connected to said plurality of outputs of said memory for converting the digital output thereof into an analog signal, and an output connected to said level control input of said level varying circuit for varying the level of the signal being processed.

2. The network of claim 1, wherein:
    said level varying circuit comprises a controlled amplifier.

3. The network of claim 1, wherein:
    said digital memory includes a plurality of memory locations each storing a control value, the number of control values and memory locations being at least equal to the revolution of said analog-to-digital converter.

4. The network of claim 1, and further comprising:
    an input level divider capable of being switched in a plurality of stages, said input level divider including an input, and an output coupled to said input offset mixer, and a plurality of control outputs;
    said memory further comprising additional storage locations for storing frequency-dependent digital control values and control inputs for those values connected to said control outputs of said level divider.

5. The network of claim 1, and further comprising:
    an adder interposed between said digital-to-analog converter and said level varying circuit, said adder including an input connected to said output offset digital-to-analog converter, an output connected to said level control input of said level varying circuit, and an input for receiving a temperature-dependent control value, said adder operable to superpose the temperature-dependent control value on the frequency dependent control value output by said analog-to-digital converter.

6. The network of claim 1, and further comprising:
    a demodulator and d.c. voltage amplifier including an input connected to said output of said level varying circuit, and an output; and
    a level indicator connected to said output of said demodulator and d.c. voltage amplifier.

7. A network for compensating the frequency response of a spectrum analyzer, comprising:
    a mixer including an input for receiving a high-frequency input signal, a heterodyne signal input and an output;
    heterodyne including a sweep voltage generator and a variable frequency heterodyne oscillator connected to and controlled by the sweep voltage of said sweep voltage generator connected to said heterodyne input of said mixer;

a level varying circuit including an input connected to said output of said mixer, a level control input, and an output for providing a compensated signal;

an analog-to-digital converter including an input connected to said sweep voltage generator and a plurality of outputs;

first means storing values each representative of a point along the sweep voltage, said first means connected to said analog-to-digital converter and operated by the output signals thereof to produce first control signals; and second means connected to said first means and connected to said level varying circuit and responsive to said control signals to control the signal level of signals traversing said level varying circuit.

* * * * *